United States Patent [19]

Wyckoff

[11] Patent Number: 4,701,984

[45] Date of Patent: Oct. 27, 1987

[54] PRINTED CIRCUIT BOARD SUPPORT

[75] Inventor: Stephen G. Wyckoff, Arlington Heights, Ill.

[73] Assignee: Illinois Tool Works Inc., Chicago, Ill.

[21] Appl. No.: 405,444

[22] Filed: Aug. 2, 1982

[51] Int. Cl.[4] .............................................. F16B 13/04
[52] U.S. Cl. ....................................... 24/573; 24/297; 174/138 D
[58] Field of Search ........................ 24/297, 305, 573; 174/138 D; 411/508–510

[56] References Cited

U.S. PATENT DOCUMENTS

| 2,946,612 | 7/1960 | Ahlgren | 411/510 X |
| 3,093,874 | 6/1963 | Rapata | 24/297 X |
| 3,688,635 | 9/1972 | Fegen | 174/138 D |
| 3,777,052 | 12/1973 | Fegen | 174/138 D |
| 3,893,208 | 7/1975 | Yuda | 174/138 D X |
| 3,910,536 | 10/1975 | Sharp et al. | 174/138 D X |
| 4,143,577 | 3/1979 | Eberhardt | 174/138 D X |
| 4,297,769 | 11/1981 | Coules | 174/138 D |

FOREIGN PATENT DOCUMENTS

| 745788 | 2/1956 | United Kingdom | 24/297 |
| 756094 | 8/1956 | United Kingdom | 411/508 |

Primary Examiner—Kenneth J. Dorner
Assistant Examiner—James R. Brittain
Attorney, Agent, or Firm—J. P. O'Brien; T. W. Buckman

[57] ABSTRACT

A printed circuit board support comprises an integral plastic molding having an elongated mounting portion adapted for insertion through an aperture in a mounting panel. The mounting portion has a head adapted to span a body adapted to be positioned inwardly of said panel, and abutment means for engaging the surface of a printed circuit board or the like. Resilient retaining means extending from the body yield resiliently upon insertion through said aperture and thereafter engage the back side of said panel. The support further has a retainer portion extending beyond the abutment means for insertion through an aperture in said printed circuit board and has resilient retaining means adapted to yield upon passage through the aperture in said printed circuit board and thereafter to bear against the opposite surface of said printed circuit board to retain said printed circuit board in supported position spaced from said panel.

1 Claim, 15 Drawing Figures

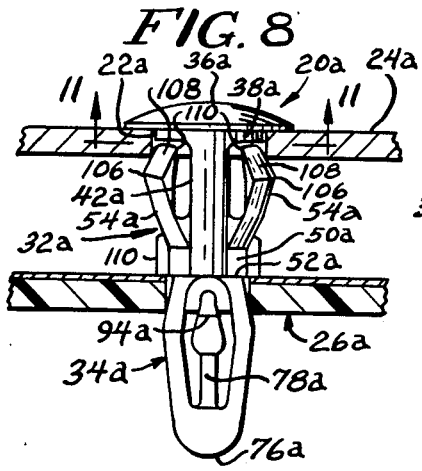
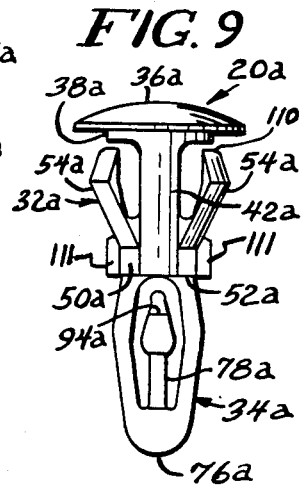
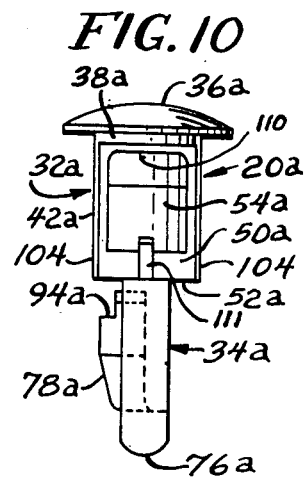
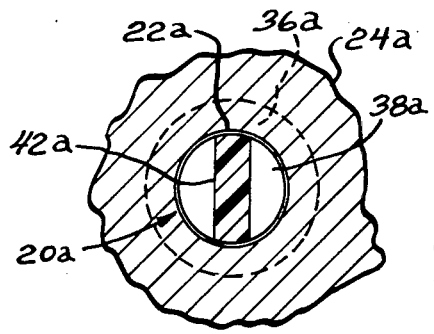
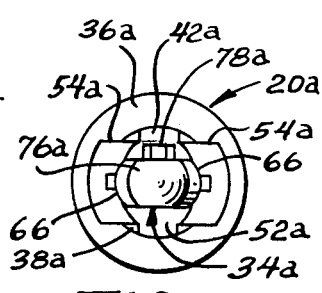
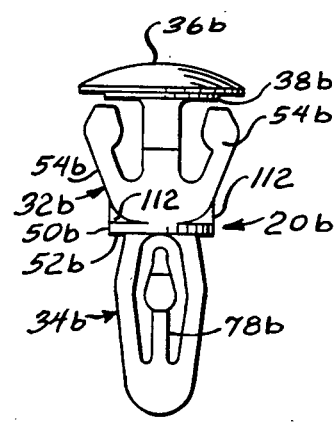
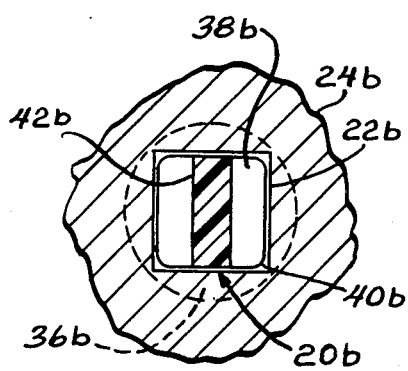
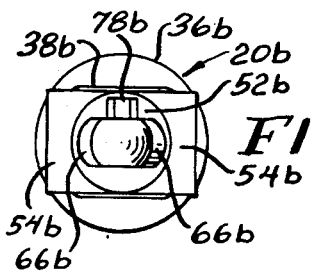

PRINTED CIRCUIT BOARD SUPPORT

BACKGROUND OF THE INVENTION

In various electronic apparatus such as radio and television receivers, computers, etc., it is common practice to utilize printed circuit boards. Such printed circuit boards comprise copper or other conductive material on an insulation substrate with the conductive material printed so as to provide interconnecting wiring or the equivalent thereof between various electrical elements. Such printed circuit boards are generally mounted within a housing and are supported by or from a steel or other sheet metal chassis.

In certain instances for economy of materials and for optimum use of space it is desired to support the printed circuit boards by the use of some insulating means directly from the steel housing of the electronic apparatus.

OBJECTS AND SUMMARY OF THE PRESENT INVENTION

It is an object of the present invention to provide a molded support for directly supporting a printed circuit board from a steel or the like housing or cabinet of an electronic apparatus.

It is a further object of the present invention to provide a molded plastic support for insertion through an aperture in a sheet steel housing or cabinet of an electronic apparatus which plastic support seals the hole through which it is inserted and coacts with other similar fasteners to support a printed circuit board in spaced relation from the housing or cabinet.

In achieving the foregoing and other objects and advantages I provide a sheet steel housing or cabinet for an electronic apparatus with a plurality of holes in predetermined locations. I further provide a plurality of like molded plastic supports which are respectively inserted through the aforesaid holes and snap-lock in place therein. The supports are supplied with heads which overlie and effectively seal the holes in the cabinet for housing. The supports further are provided with snap-in retaining means which respectively fit through apertures in a printed circuit board to retain the printed circuit board in parallel, spaced relation to the shell of the housing or cabinet. The printed circuit board thus is mounted in insulating and spaced relation from the shell, but in close relation thereto for economy of space. The supports are inexpensive to produce and easy to assemble with the housing, and eliminate the need for any discrete chassis within the housing, thereby attaining considerable economies in manufacturing.

THE DRAWINGS

The invention will best be understood with reference to the following specification when taken in connection with the accompanying drawing, wherein:

FIGS. 8-12 are views similar to FIGS. 1-5, respectively, showing a modification of the invention; and FIGS. 13-15 are views similar to FIGS. 2, 4 and 5, respectively, showing another modification of the invention.

DETAILED DISCLOSURE OF THE ILLUSTRIATIVE EMBODIMENT

Figure 6:
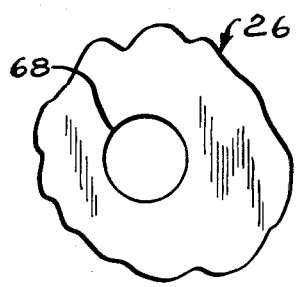
FIG. 6 is a fragmentary plan view of a portion of the printed circuit board showing one shape of aperture therein.
Figure 7:
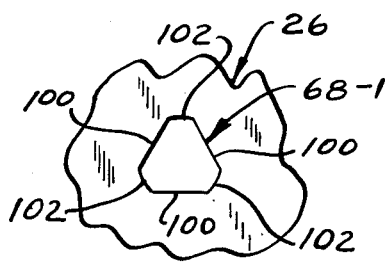
FIG. 7 is a view similar to FIG. 6 showing a different shape of aperturs.

One embodiment of a printed circuit board support 20 constructed in accordance with the present invention is shown in FIGS. 1-5, ancillary features of the printed circuit board being shown in FIGS. 6 and 7. The support 20 is molded of a suitable resilient plastic material, nylon being a preferred substance, and is inserted through an aperture 22 in a sheet steel or equivalent panel or shell of the cabinet or housing of an electronic apparatus such as a computer, a radio receiver, a television receiver, etc. The aperture 22 in the present embodiment of the invention is square. The support 20 acts to hold a printed circuit board 26 in spaced, parallel relation to the panel or shell 24. As is well known, the printed circuit board 26 comprises an insulating substrate 28 with copper or other conductive "wiring" 30 deposited thereon.

Figure 1:
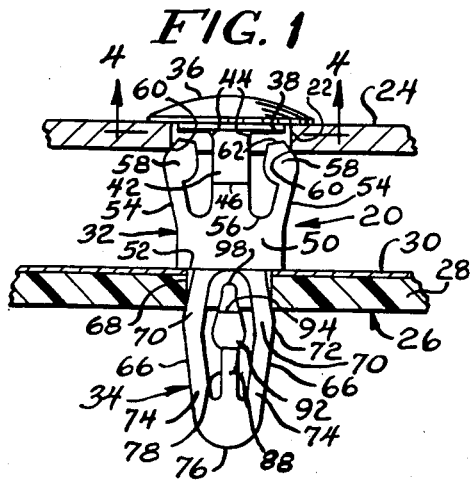
FIG. 1 is a side view of a support constructed in accordance with the present invention shown in assembled relation with a housing or cabinet shell and a printed circuit board, the shell and printed circuit board being shown in section.
Figure 4:
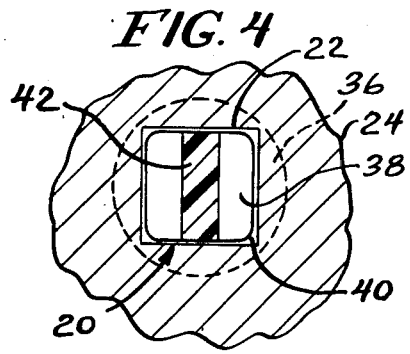
FIG. 4 is a cross-sectional view taken substantially along the line 4—4 in FIG. 1.
Figure 5:
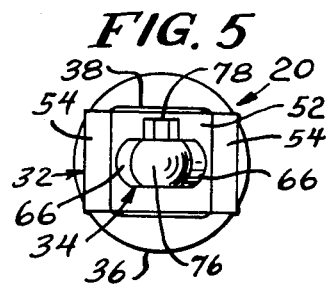
FIG. 5 is a bottom end view of the support.

The support 20 is of integral construction and includes a mounting portion 32 and a retainer portion 34. The retainer portion comprises a head 36 in the form of a low profile dome of slighter greater diameter than the diagonal of the square aperture 22 whereby the head overlies and closes the aperture 22 with the support in installed position as shown in FIGS. 1 and 4. A square anti-rotational section 38 immediately underlies the head 36 and is of slightly lesser dimension than the square aperture 22, whereby largely to fill the aperture, and thus to prevent turning of the support in the aperture, while allowing for a slight degree of lateral movement to compensate for variations, in production tolerances. The corners of the square anti-rotational section 38 are rounded at 40 for convenience of insertion of the square section 38 into the aperture 22, and also for convenience of molding. The thickness of the anti-rotational section 38 is substantially less than the thickness of the panel 24, being on the order of ¼ or ⅓ of the thickness of the panel 24.

Figure 2:
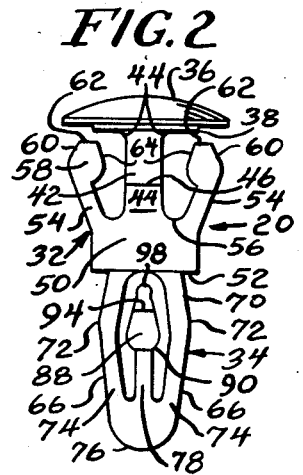
FIG. 2 is a similar side view of the support prior to installation.
Figure 3:
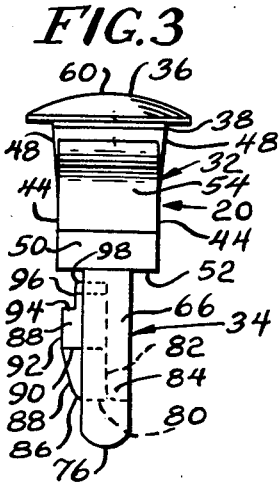
FIG. 3 is a side view of the support taken at right angles to FIG. 2.

The stem 42 extends down from the head 36, and has a relatively narrow transverse dimension as viewed in FIGS. 1 and 2. As so viewed the stem 42 joins the section 38 at fillets 44. The stem 42 as viewed in FIG. 3 has a relatively wide transverse dimension, the proportions being generally seen in FIG. 4, and has adjacent its lower portions parallel side walls 44. Upwardly of an intermediate line 46 the side walls of the stem taper outwardly at 48 as seen in FIG. 3. This taper facilitates centering of the support in the aperture 22.

The mounting portion 32 has a lower body 50 with an under surface 52 which abuts the upper surface of the printed circuit board 26, specifically the conductive portion 30 thereof, and which in the present example is square. Resilient arms 54 extend diagonally upwards and outwardly from the body 50, being joined to the body and the stem 42 by arcuate segments 56. Adjacent the upper portions of the arms are enlarged portions 58 of generally cylindrical shape as seen in FIGS. 1 and 2, and having reversely or inwardly tapering surfaces 60 at the overlying outer portions of the arms which engage the underside of the panel 24 along the edges of the aperture 22. Substantially flat upper surfaces 62 provide the upper limits to the arms 54, and tapering surfaces 64 join the top surfaces to the cylindrical portions 58.

It will be seen in FIGS. 1 and 2 that the arms 54 coact with the body 50 and the stem 42 to form generally the shape of a W. Comparison of FIGS. 2 and 1 reveals that the arms are flexed slightly inwardly in installed position from the position prior to installation, whereby to provide wedging, resilient pressure against the inner edges of the aperture 22, and thus to hold the underside of the head 36 tightly against the top or outer surface of the panel or shell 24 for a good sealing and non-rattling engagement. It will be understood that as the support is pushed through the aperture 22 the arms 54 are cammed and deflected inwardly toward the stem 42 to a much greater degree than FIG. 1. The inner tapering surfaces 64 provide clearance relative to the stem 42 during such installation and flexing.

The retainer portion 34 extends downwardly from the under surface 52 of the mounting portion and includes a pair of spaced apart arms 66 having upper portions spaced inwardly from the outer margins of the body 50 to permit insertion through an aperture 68 in the printed circuit board 26. At their juncture to the under surface 52 of the head the arms provide a clearance space relative to the aperture 68, and taper downwardly and outwardly therefrom at 70 to elbows 72, the arms 66 below the elbows 72 converging at 74 to a rounded nose 76.

The arms 66 as viewed in FIG. 3, at right angles to the shape just discussed in connection with FIGS. 1 and 2, are generally flat. A latch 78 in the form of an upstanding arm is integrally joined to the nose portion 76 and upstands between the arms 66. As is best seen in FIG. 3 the latch is offset from the arms 66 and is joined to the upper portion of the nose 76 at a minimum dimension indicated at 80. The inner or back surface 82 extends substantially straight upwards from the junction point, there being an arcuate segment 84 between this surface and the upper surface of the nose. The opposite or outer surface of the latch 78 projects out beyond the arms 66, having a lower starting arcuate segment 86 leading to an outwardly tapered surface 88. At a junction line 90 the outer surface no longer tapers outwardly, but extends straight up at 92 to a shelf or shoulder 94, there being an inner vertical wall 96 extending above the shoulder and spaced inwardly from the surface 92.

Returning to FIGS. 1 and 2, the latch 78 will be seen to have parallel side walls 88 up to the juncture line 92, at which point the side walls bulge outwardly to form a substantially cylindrical portion at 88, tapering inwardly thereabove past the shoulder 94 to a cylindrical portion 98 forming the upper limit of the latch.

The retainer portion of the support is inserted through the aperture 68 in the printed circuit board 26 with the arms 66 collapsing somewhat inwardly to permit passage. The arms then spring out to the position shown in FIG. 1, slightly short of the initial position of FIG. 2, retaining resilient pressure on the inner margin of the aperture 66 for rattle-free positioning of the support in the printed circuit board. In addition, the shoulder 94 underlies the printed circuit board to provide positive retention of the support retainer portion in the printed circuit board. The shoulder 94 may be spaced slightly below the lower surface of the printed circuit board in connection with production tolerances.

The aperture 68, as may be seen in FIG. 6, may simply be a circular aperture. The arms 66 collapse toward the latch 78 to permit insertion, while the latch hinges back to a position generally between the arms 66. When the undersurface 52 of the body 50 bottoms against the top surface of the printed circuit board the arms 66 have passed through the printed circuit board to a position beyond the elbows 72, and have sprung back partly outward as shown in FIG. 2, thereby forming a generally resilient and snug connection with the printed circuit board. In addition, the shoulder 94 has passed the bottom of the printed circuit board and the latch has sprung back to its original condition with the shoulder 94 underlying the printed circuit board.

Other shapes for the aperture 68 are contemplated, and for example there is shown in FIG. 7 a generally triangular aperture 68a having three straight equal length and equal angularly arranged sides 100 joined by three arcs 102 lying on the same radius as the circumference of the aperture 68. The retainer portion of the support interfits with the aperture in FIG. 7 in generally the same way as with the circular aperture, with the two legs 66 generally lying in two adjacent ones of the arcs 102 and with the latch 78 cooperating with the remaining arc.

A further embodiment of the invention is shown in FIGS. 8–12 and may be preferred under certain circumstances. The embodiment of FIGS. 8–12 is in most respects identical or similar to that in FIGS. 1–5, and like numbers are used with the addition of the suffix "a" to identify similar parts, and thus to avoid the necessity of repetition. Distinctions reside in the provision of a circular section 38a rather than the square section previously disclosed, the aperture 22a in the panel or shell 24a being correspondingly circular. Additionally, the body 50a is generally circular in cross-section. However, the body is of somewhat lesser diameter than the long dimension of the stem 42a, whereby the lower corners of the latter project from the body as shown at 104.

The outer surfaces of the arms 54a comprise arcs of circles, and the inner surfaces thereof are likewise curved. The arms 54a are provided with marked exterior elbows 106 with the outer surfaces of the arms 54a first diverging upwardly and then converging upwardly at 108 to relatively sharp upper edges 110 with the outer surfaces merged with the inner surfaces. Longitudinal ribs 111 extend from the under surface 52a along the outer surfaces of the body 50a and part way up on to the arms 54a to reinforce the bottom portions of the arms, and for an improved abutment at the undersurface 52a.

The advantages to the embodiment of the invention of FIGS. 8 and 12 are that no rotational orientation or positioning of the support is required, and the abutment area with the upper face of the printed circuit board 26a is reduced, whereby advantages in avoiding or coaction with the conductive material thereon can be achieved.

A further embodiment of the invention is shown in FIGS. 13–15, and is very similar to the first embodiment shown and described. Prolixity of description again is avoided by the use of like numerals with the addition of the suffix "b" to identify similar parts. The section 38b under the head 36b is again square, and the corresponding aperture 22b in the panel 24b is therefore square. A distinction from the first embodiment resides in the fact that the body 50b is round or cylindrical in nature, merging at tapered corners 112 into the arms 54b.

In the form of the invention shown and described in connection with FIGS. 13–15, the cylindrical body produces a smaller area of engagement with the upper face of the printed circuit board as contrasted with the embodiments of FIGS. 1–5.

In each embodiment of the invention the retainer portion 34 is of lesser diameter or transverse dimension than as the mounting portion, whereby the retainer portion slips readily through the aperture in the supporting panel, thus simplifying installation. The panel has specifically been referred to as consisting of steel as one example, but other materials are suitable, including metals, aluminum being a prime example, or various plastics materials, either fiber-reinforced or not reinforced. In each instance the support is firmly but resiliently mounted on the panel with the head of the support overlying and hiding the aperture in the panel, thus providing a decorative appearance and precluding entrance of unwanted materials or objects that could damage the electrical circuitry of the apparatus or cause injury to one poking a foreign object through the aperture. The positioning of the support is firm, but slightly resilient to accommodate variations in production tolerances. Resilience of the entire support affords adaptation to production tolerances in both the panel and the printed circuit board while retaining the printed circuit board in desired position within rather small and permissible variations. The plastic nature of the support provides electrical insulation as between the mounting panel and the printed circuit board, and also affords a certain degree of shock mount for the printed circuit board to avoid damage to the board itself or to electronic components or elements mounted thereon.

Various changes in structure will no doubt occur to those skilled in the art, and will be understood as comprising a part of the present invention insofar as they fall within the spirit and scope of the appended claims.

The invention is claimed as follows:

1. A printed circuit board support of integral plastic construction comprising a head and downwardly extending body, said body having a mounting portion and retainer portion where said mounting portion is designed to be inserted into a polygonal aperture of a mounting panel and where said retainer portion is designed to be inserted in a mounting aperture of a printed circuit board, said head having a larger cross sectional dimension than said polygonal aperture and having an anti-rotational section formed on its undersurface, said anti-rotational section having a cross sectional shape the same as but slightly smaller than said polygonal aperture and having a thickness less than one third the thickness of said mounting panel, said retainer portion including abutment means for engaging one surface of said printed circuit board which faces said mounting panel and resilient retaining means that yields upon insertion through said mounting aperture of said printed circuit board and that returns to original position thereafter to bear against the opposite surface to said one surface of said printed circuit board, and said mounting portion includes a stem integrally connected in a normal relation to the center of said anti-rotational section and a pair of symmetrically disposed resilient arms extending in a diverging relation away from said stem in a direction toward said head and having outer free ends converging towards said stem, said outer free ends being spaced a small distance from said anti-rotational secton whereby said resilient arms yield resiliently upon insertion through said polygonal aperture and thereafter return toward the initial position to cause said free ends to engage the back said of said panel to mount said support in said panel.

* * * * *